United States Patent [19]

Blankenship

[11] Patent Number: 5,486,785
[45] Date of Patent: Jan. 23, 1996

[54] CMOS LEVEL SHIFTER WITH FEEDFORWARD CONTROL TO PREVENT LATCHING IN A WRONG LOGIC STATE

[75] Inventor: Dennis R. Blankenship, Durham, N.C.

[73] Assignee: Mitsubishi Semiconductor America, Inc., Durham, N.C.

[21] Appl. No.: 316,462

[22] Filed: Sep. 30, 1994

[51] Int. Cl.⁶ .................................................. H03L 5/00
[52] U.S. Cl. .......................... 327/306; 327/309; 327/540; 326/33; 326/68
[58] Field of Search ............................ 327/306, 540, 327/541, 542; 326/30, 33, 66, 67, 68, 71

[56] References Cited

U.S. PATENT DOCUMENTS

| | | | |
|---|---|---|---|
| 4,150,308 | 4/1979 | Adlhoch | 326/68 |
| 4,314,166 | 2/1982 | Bismarck | 307/475 |
| 4,315,223 | 2/1982 | Haque | 330/253 |
| 4,405,870 | 9/1983 | Eden | 307/446 |
| 4,472,644 | 9/1984 | Kirsch | 307/269 |
| 4,558,235 | 12/1985 | White et al. | 326/116 |
| 4,618,785 | 10/1986 | van Tran | 327/53 |
| 4,623,803 | 11/1986 | Thompson et al. | 307/475 |
| 4,656,373 | 4/1987 | Plus | 327/543 |
| 4,707,623 | 11/1987 | Bismarck | 326/68 |
| 4,723,112 | 2/1988 | Diller et al. | 330/258 |
| 4,806,799 | 2/1989 | Pelley, III et al. | 307/475 |
| 4,835,489 | 5/1989 | Monticelli | 330/277 |
| 4,845,381 | 7/1989 | Cuevas | 327/333 |
| 4,845,675 | 7/1989 | Krenik et al. | 365/203 |
| 4,860,257 | 8/1989 | Choi | 365/189.11 |
| 4,910,713 | 3/1990 | Madden et al. | 365/189.11 |
| 4,937,476 | 6/1990 | Bazes | 327/541 |
| 4,970,691 | 11/1990 | Atsumi et al. | 365/189.11 |
| 4,980,583 | 12/1990 | Dietz | 326/68 |
| 4,980,651 | 12/1990 | Koullias | 330/295 |
| 5,012,137 | 4/1991 | Muellner | 326/66 |
| 5,113,097 | 5/1992 | Lee | 326/81 |
| 5,133,097 | 7/1992 | Pyles | 5/623 |
| 5,144,160 | 9/1992 | Lee et al. | 307/353 |
| 5,148,061 | 9/1992 | Hsueh et al. | 307/475 |
| 5,148,119 | 9/1992 | Wright et al. | 330/259 |
| 5,231,318 | 7/1993 | Reddy | 307/530 |
| 5,241,225 | 8/1993 | Okajima et al. | 307/475 |
| 5,245,228 | 9/1993 | Harter | 326/68 |

*Primary Examiner*—Timothy P. Callahan
*Assistant Examiner*—Kenneth B. Wells
*Attorney, Agent, or Firm*—Lowe, Price, LeBlanc & Becker

[57] ABSTRACT

A level shift circuit provided with feedforward control to keep the circuit from latching in a wrong logic state comprises a pair of input transistors acted as a differential amplifier and a pair of output hold transistors coupled to output nodes of the circuit. The feedforward control is performed by a pair of feedforward transistors respectively coupled in parallel to the corresponding output hold transistors, and by a pair of isolation transistors that isolate the output nodes from gates of the respective feedforward transistors.

13 Claims, 4 Drawing Sheets

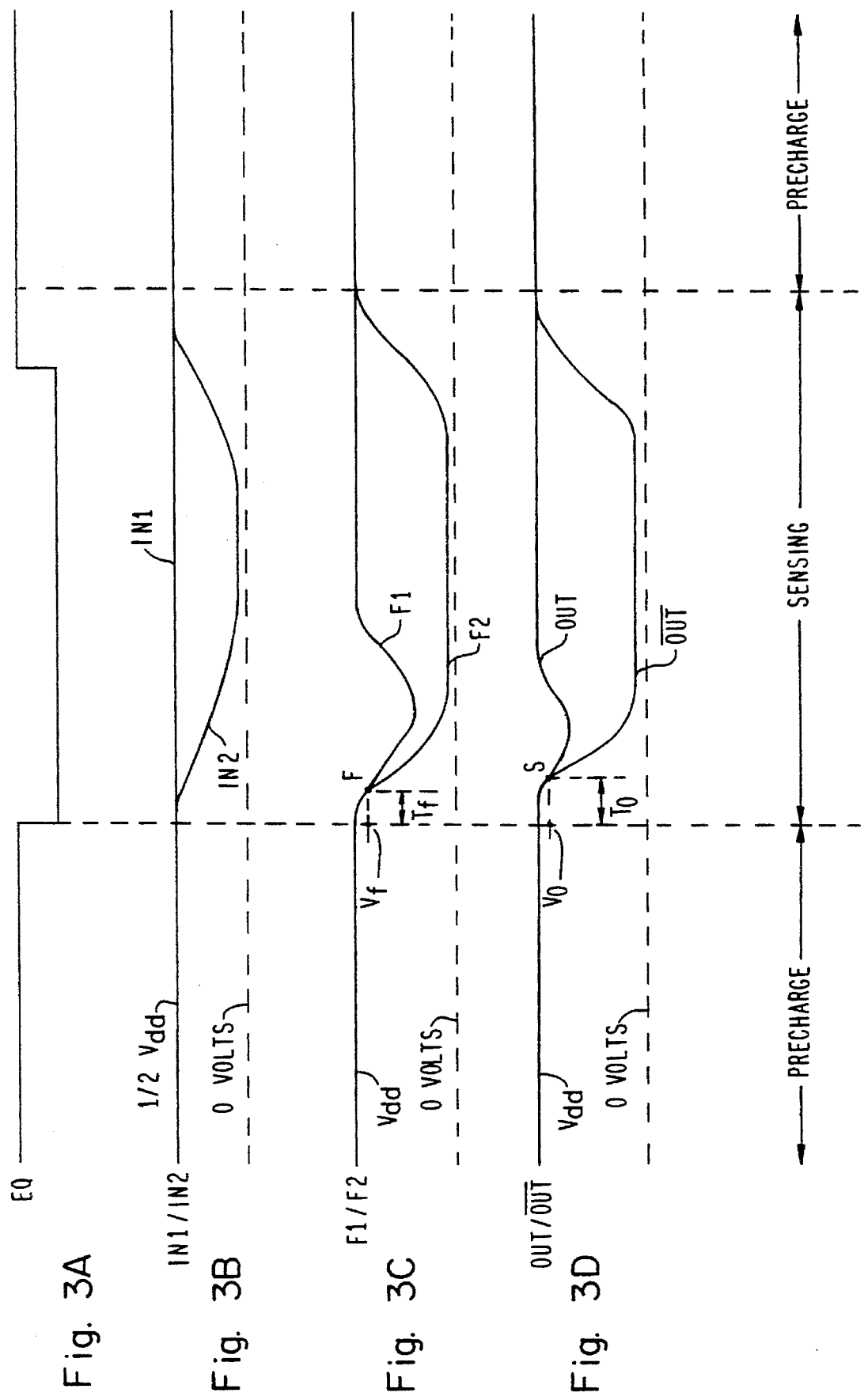

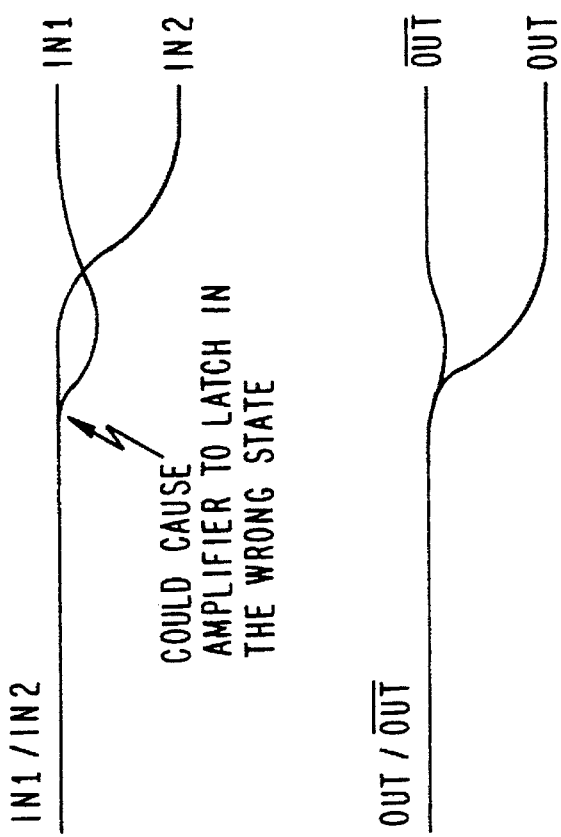

CMOS LEVEL SHIFTER WITH FEEDFORWARD CONTROL TO PREVENT LATCHING IN A WRONG LOGIC STATE

TECHNICAL FIELD

This invention relates to a voltage level shifting circuit and, more particularly, to a CMOS level shifter provided with feedforward control.

BACKGROUND ART

A level shifter is conventionally used to change the logic level at the interface between two different semiconductor logic systems. For example, FIG. 1 of the drawings illustrates a level shifting interface 30 between a SRAM 32 and a sensing amplifier 34 that amplifies data read from the SRAM 32. As the differential voltage representing the data supplied from the SRAM is not large enough to support reliable operation of the sensing amplifier 34, the level shifter 30 is provided at the interface to translate a small voltage range of the SRAM into a larger voltage range required by the sensing amplifier. The level shifter 30 may comprise an input differential amplifier 36 supplied by the output voltage of the SRAM and an output stage 38 providing a signal that varies over a larger voltage range sufficient to support operation of the sensing amplifier. The output stage may be implemented, for example, by a pair of hold transistors that are coupled to the output of the differential amplifier 36 to provide latching the outputs of the shifter in the corresponding logic state in accordance with the voltage values at the inputs of the differential amplifier.

However, in a high-speed level shifter, transient variations of the input values that occur when the inputs change their logic states, could cause the output transistors to latch in the wrong state. Accordingly, erroneous data would be supplied to the sensing amplifier 34.

Hence, it would be desirable to keep the level shifter from latching in a wrong logic state, in order to increase the reliability of its operation.

DISCLOSURE OF THE INVENTION

One advantage of the invention is in providing an arrangement that prevents a high-speed level shifter from latching in a wrong logic state when its inputs change their states.

Another advantage of the invention is in providing a high-speed CMOS level shifter with increased reliability of its operation.

The above and other advantages of the invention are achieved, at least in part, by providing apparatus for level shifting from an input voltage range to an output voltage range that comprises input differential amplifying means responsive to first and second input signals varying over the input voltage range for forming a differential signal representative of a difference between the first and second input signals. Output means are responsive to the differential signal for latching the level shifter in a first output logic state when the first input signal is larger than the second input signal, and for latching in a second output logic state when the first input signal is smaller than the second input signal, to form an output signal varying over said output voltage range. Feedforward control means responsive to the first and second input signals are provided to improve level shifting and to prevent the output means from latching in the second output logic state when the first input signal is larger than the second input signal, and to prevent the output means from latching in the first output logic state when the first input signal is smaller than the second input signal.

In accordance with a preferred embodiment of the invention, the output means comprises first and second output transistors respectively coupled to first and second output nodes of the output means, and feedforward means comprises first and second feedforward transistors respectively coupled in parallel to the first and second output transistors, and first and second isolation transistors respectively coupled to the first and second output transistors to isolate a gate of the first feedforward transistor from the second output node and to isolate a gate of the second feedforward transistor from the first output node. The first and second output and feedforward transistors may be of a p-channel MOS type, and the first and second isolation transistors may be of a n-channel MOS type.

Preferably, input differential amplifying means comprises first and second input transistors respectively coupled to first and second input nodes supplied with the first and second input signals. The first and second input transistors may be of a n-channel MOS type and may be coupled to a current source.

In accordance with one aspect of the present invention, the output means and feedforward means are supplied with an equalize signal to be precharged before latching in the corresponding output logic state. The equalize signal sets the first and second output nodes and the gates of the first and second feedforward transistors to an equalized voltage level corresponding to an external voltage supplied to the first and second output and feedforward transistors.

In accordance with a further aspect of the invention a CMOS level shift circuit is provided for translating an input voltage level into an output voltage level formed at first and second output nodes. The circuit comprises first and second input transistors respectively supplied with first and second input signals representative of the first input voltage level. First and second output transistors are respectively coupled between the first and second output nodes and a source of supply voltage and have their control electrodes connected to each other. First and second feedforward transistors are respectively coupled in parallel with the first and second output transistors. A first isolation transistor is coupled between a control electrode of the second feedback transistor and the first output node, and has its control electrode coupled to the second output node. Finally, a second isolation transistor is coupled between a control electrode of the first feedback transistor and the second output node, and has its control electrode coupled to the first output node.

The circuit may also comprise an equalize transistor coupled between the first and second output nodes and having its control electrode supplied with an equalize signal for equalizing potentials at the control electrodes of the first and second feedback electrodes and at the first and second output nodes. The control electrodes of the first and second output transistors may be also supplied with the equalize signal.

In accordance with the preferred embodiment of the invention, the first input transistor is coupled between the control electrode of the second feedforward transistor and a grounded current source, and has its control electrode supplied with the first input signal. The second input transistor is coupled between the control electrode of the first forward transistor and the grounded current source, and has its control electrode supplied with the second input signal. The first and second input and isolation transistors may be of a n-channel MOS type, and the first and second output and feedforward transistors may be of a p-channel MOS type.

Still other advantages of the present invention will become readily apparent to those skilled in this art from the following detailed description, wherein only the preferred embodiment of the invention is shown and described, simply by way of illustration of the best node contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF DRAWINGS

FIGS. 3A–3D are waveforms that illustrate operation of the level shifter shown in FIG. 2.

FIGS. 4(a–b) shows an example of latching in a wrong logic state.

BEST MODE FOR CARRYING OUT THE INVENTION

Figure 1:
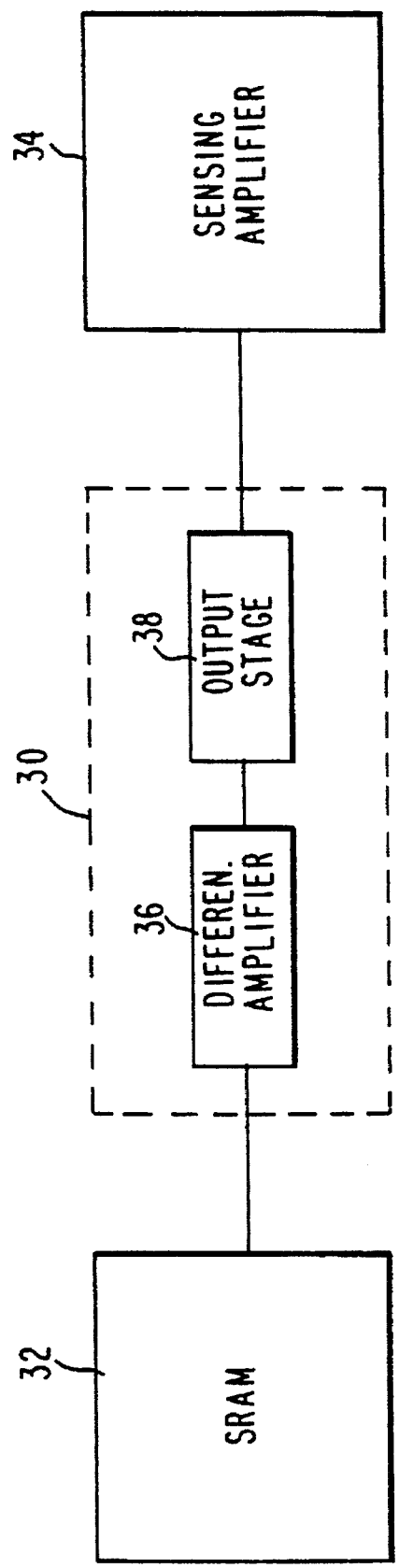
FIG. 1 is a block diagram that illustrates a prior art level shifter.
Figure 2:
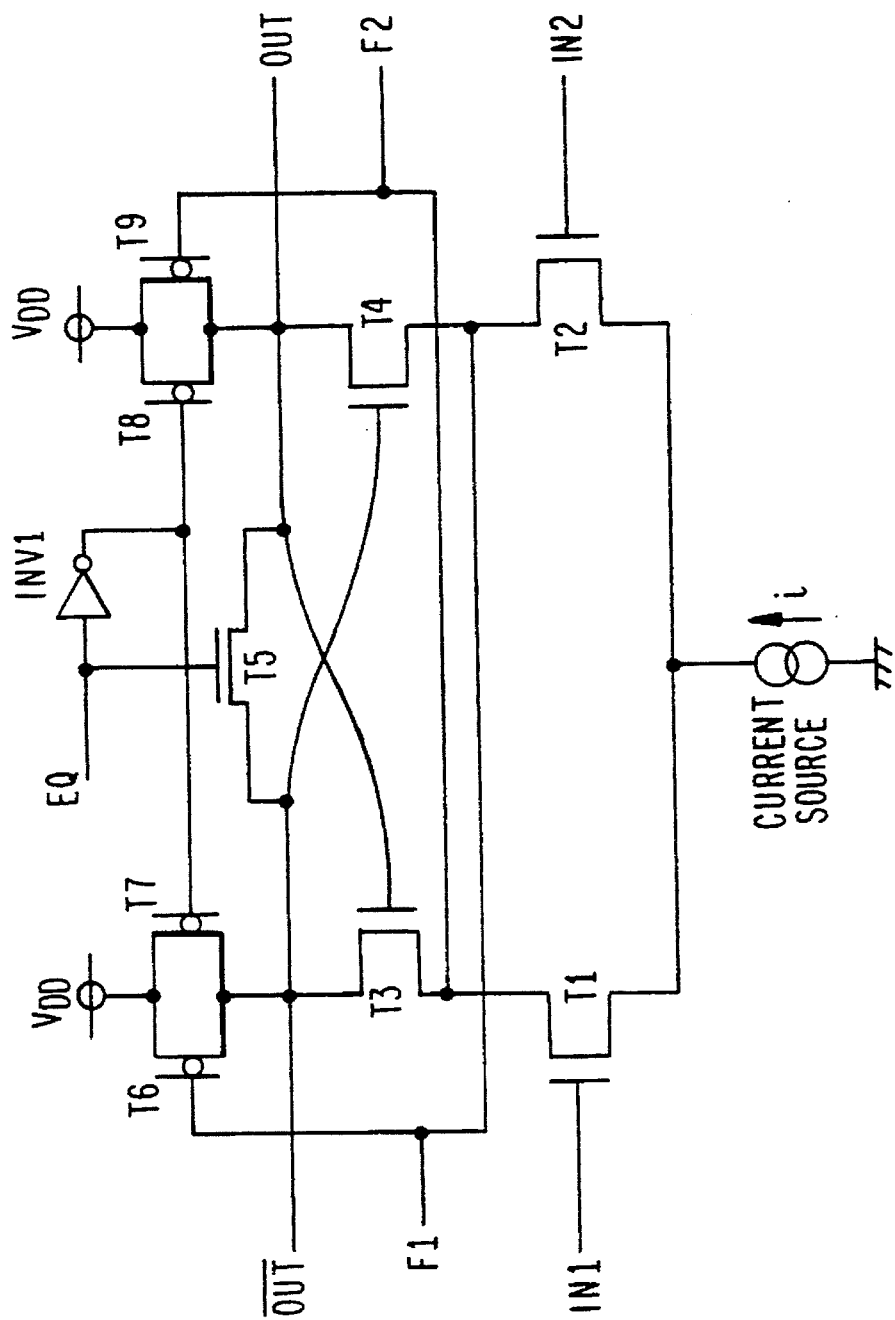
FIG. 2 is an electrical diagram of the CMOS level shifter in accordance with the present invention.

Reference is now made to FIG. 2, wherein a CMOS level shift circuit comprises two n-channel MOS transistors T1 and T2 that act as a differential input amplifier for input voltages IN1 and IN2 respectively supplied to their gates. A grounded current source I supplies current to the input transistors T1 and T2.

Through isolation transistors T3 and T4, the transistors T1 and T2 are respectively coupled to transistor pairs T6, T7 and T8, T9 that are formed by output hold p-channel MOS transistors T7 and T8 respectively connected in parallel to feedforward p-channel MOS transistors T6 and T9. The output hold transistors T7 and T8 serve to hold up complementary output nodes $\overline{OUT}$ and OUT of the level shift circuit. They latch the circuit output in a stable high or low condition depending on the voltage difference at the inputs. The feedforward transistors T6 and T9 in conjunction with the isolation transistors T3 and T4 provide feedforward control mechanism that will be described in more detail later. The transistor pairs T6, T7 and T8, T9 are supplied with power supply voltage $V_{DD}$, e.g. 3.0 volts.

The feedforward transistors T6 and T9 have their gates respectively connected to drains of the input transistors T2 and T1. The isolation transistors T4 and T3 respectively isolate the gates of the transistors T6 and T9 from the output nodes OUT and $\overline{OUT}$. The gates of isolation transistors T4 and T3 are cross-coupled to the output nodes $\overline{OUT}$ and OUT.

An equalize signal EQ supplied through an invertor INV1 to the gates of the output hold transistors T7 and T8 precharges the output nodes OUT and $\overline{OUT}$ to the $V_{DD}$ level. The equalize signal EQ also is supplied to a gate of an equalize n-channel MOS transistor T5 coupled between the output nodes OUT and $\overline{OUT}$ to equalize the voltage at the output nodes.

As shown in FIG. 3A, the equalize signal EQ is used to control operation of the level shift circuit. Prior to sensing the input voltages, the signal EQ is set to a high level and the current source I is turned off to place the circuit in a precharge mode. As a result, the output nodes OUT and $\overline{OUT}$ and the gates of the feedforward transistors T6 and T9 respectively labelled in FIG. 2 as feedforward nodes F1 and F2, are precharged to the $V_{DD}$ level. Waveforms at the feedforward nodes F1 and F2, and at the output nodes OUT and $\overline{OUT}$ are respectively shown in FIGS. 3C and 3D.

The level shift circuit begins sensing the input voltages, when the signal EQ is switched to a low level and the current source I is activated. In the sensing mode, the voltage difference between the input signals IN1 and IN2 shown in FIG. 3B determines which feedforward node F1 or F2 receives more current. If the voltage IN1 is greater than the voltage IN2, as depicted, the feedforward node F2 receives more current than the feedforward node F1. For example, the signal IN1 may be represented by a reference signal maintained at the ½ $V_{DD}$ level. As shown in FIG. 3B, the signal IN2 may go down from the ½ $V_{DD}$ level towards the 0 V level. Similarly to conventional level shift circuits, a change of the input signal IN2 causes the signal at the output node $\overline{OUT}$ to be switched.

As discussed above, the level shift circuit is provided with the feedforward control performed by the feedforward transistors T6 and T9 in conjunction with the isolation transistors T3 and T4. As shown in FIG. 3C, at the beginning of the sensing mode, both of the voltages at the feedforward nodes F1 and F2 drop to an intermediate level Vf, before they start to split (in point F). As the n-channel transistors T3 and T4 isolate the output nodes OUT and $\overline{OUT}$ from the feedforward nodes F1 and F2, they significantly reduce the voltage level Vo, until which the voltages at the output nodes OUT and $\overline{OUT}$ drop following the voltages at the nodes F1 and F2, before splitting in point S in FIG. 3D. Also, as shown in FIG. 3D, the isolation transistors T3 and T4 cause the time period To, during which the output voltages reach the splitting point S, to be larger than the time period Tf of getting to the splitting point F in FIG. 3C. Accordingly, the feedforward control causes the output switching of the shifter to occur more gradually to keep the shifter from latching in a wrong logic state when the input voltages change their states at the beginning of the sensing mode. For example, as shown in FIG. 4, latching in a wrong logic state could cause a low level to be formed at the output node OUT and a high level to be formed at the output node $\overline{OUT}$, when the input voltage IN1 is larger than the input voltage IN2.

The feedforward control provided by the feedforward and isolation transistors also aids in the differential amplification of signals OUT and $\overline{OUT}$. In particular, if the node F2 receives more current than the node F1, its voltage decreases (FIG. 3C) to gradually turn on the feedforward transistor F9, which causes the output signal OUT to be pulled up to the $V_{DD}$ level. Depending on the difference between the signals IN1 and IN2, the voltage at the node F1 also may be large enough to turn on the feedback transistor T6, which causes the output signal $\overline{OUT}$ to be pulled up to the $V_{DD}$ level. However, as the voltage at the node F2 decreases quicker than the voltage at the node F1, the transistor T9 turns on stronger than the transistor T6, and the output voltage OUT goes towards the $V_{DD}$ level quicker than the output voltage $\overline{OUT}$.

The cross-coupled isolation transistors T3 and T4 cooperate with the feedforward transistors T6 and T9 to provide differential amplification of the outputs OUT and $\overline{OUT}$. As the voltage $\overline{OUT}$ approaches 0 V, the isolation transistor T4 begins to shut off. However, when the voltage $\overline{OUT}$ approaches $V_{DD}$, the isolation transistor T3 remains turned on.

When a sensing operation is completed, the level shift circuit again is placed in the precharge mode to provide precharging before the next sensing operation.

As shown in FIGS. 3B and 3D, the level shift circuit translates the input signal IN2 that switches over a small voltage range (e.g. from ½ $V_{DD}$ to about 0 V) into the output signal $\overline{OUT}$ that switches over a larger voltage range (e.g. from $V_{DD}$ to about 0 V).

Although the present invention has been described with reference to particular means, materials and embodiments, from the foregoing description one skilled in the art can easily ascertain the essential characteristics of the present invention and various changes and modifications may be made to adapt the various uses and characteristics without departing from the spirit and scope of the present invention as described by the claims that follow.

I claim:

1. Apparatus for level shifting from an input voltage range to an output voltage range, comprising:

input differential amplifying means including first and second input transistors respectively supplied with first and second input signals having the amplitudes varying over said input voltage range, for forming a differential signal representative of a difference between the amplitudes of said first and second input signals, output means responsive to said differential signal for latching in a first output logic state when said first input signal is larger than said second input signal, and for latching in a second output logic state when said first input signal is smaller than said second input signal, to form an output signal varying over said output voltage range, and feedforward control means including first and second feedforward transistors respectively coupled to said second and first input transistors for preventing said output means from latching in said second output logic state when said first input signal is larger that said second input signal, and for preventing said output means from latching in said first output logic state when said first input signal is smaller than said second input signal, wherein said output means comprises first and second output transistors respectively coupled to first and second output nodes of said output means, said first and second feedforward transistors are respectively coupled in parallel to said first and second output transistors, and first and second isolation transistors are respectively coupled to said first and second output transistors to prevent a signal formed at said second output node from being supplied to a gate of said first feedforward transistor and to prevent a signal formed at said first output node from being supplied to a gate of said second feedforward transistor.

2. The apparatus of claim 1, wherein said first and second output and feedforward transistors are of a p-channel MOS type, and said first and second isolation transistors are of a n-channel MOS type.

3. The apparatus of claim 1, wherein said first and second input transistors are of n-channel MOS type.

4. The apparatus of claim 1, wherein said first and second input transistors are coupled to a current source.

5. The apparatus of claim 1, wherein said output means and said feedforward means are supplied with an equalize signal to precharge said output means and said feedforward means before said output means latches in one of said first and second output logic state.

6. The apparatus of claim 5, wherein said equalize signal sets said first and second output nodes and the gates of said first and second feedforward transistors to an equalized voltage level so as to supply them with equal voltages.

7. The apparatus of claim 6, wherein said equalized voltage level corresponds to an external voltage supplied to said first and second output and feedforward transistors.

8. A CMOS level shift circuit for translating an input voltage level into an output voltage level formed at first and second output nodes, comprising:

first and second input transistors respectively supplied with first and second input signals having the peak amplitudes at said first input voltage level, first and second output transistors respectively coupled between said first and second output nodes and a source of supply voltage and having their control electrodes connected to each other, first and second feedforward transistors respectively coupled in parallel with said first and second output transistors, a first isolation transistor coupled between a control electrode of said second feedforward transistor and said first output node to prevent an output signal at said first output node from being supplied to the control electrode of said second feedforward transistor, and having its control electrode coupled to said second output node, and a second isolation transistor coupled between a control electrode of said first feedforward transistor and said second output node to prevent an output signal at said second output node from being supplied to the control electrode of said first feedforward transistor, and having its control electrode coupled to said first output node.

9. The circuit of claim 8, further comprising an equalize transistor coupled between said first and second output nodes and having a control electrode supplied with an equalize signal for equalizing potentials at the control electrodes of said first and second feedback electrodes and at said first and second output nodes.

10. The circuit of claim 9, wherein the control electrodes of said first and second output transistors are supplied with said equalize signal.

11. The circuit of claim 8, wherein said first input transistor is coupled between the control electrode of said second feedforward transistor and a grounded current source, and has its control electrode supplied with said first input signal.

12. The circuit of claim 11, wherein said second input transistor is coupled between the control electrode of said first forward transistor and said grounded current source, and has its control electrode supplied with said second input signal.

13. The circuit of claim 8, wherein said first and second input and isolation transistors are of a n-channel MOS type, and said first and second output and feedforward transistors are of a p-channel MOS type.

\* \* \* \* \*